United States Patent
Trulli et al.

(10) Patent No.: US 9,978,698 B1
(45) Date of Patent: May 22, 2018

(54) INTERCONNECT STRUCTURE FOR ELECTRICAL CONNECTING A PAIR OF MICROWAVE TRANSMISSION LINES FORMED ON A PAIR OF SPACED STRUCTURE MEMBERS

(71) Applicant: Raytheon Company, Waltham, MA (US)

(72) Inventors: Susan C. Trulli, Lexington, MA (US); Christopher M. Laighton, Boxborough, MA (US); Elicia K. Harper, Chelsea, MA (US)

(73) Assignee: Raytheon Company, Waltham, MA (US)

( * ) Notice: Subject to any disclaimer, the term of this patent is extended or adjusted under 35 U.S.C. 154(b) by 0 days. days.

(21) Appl. No.: 15/415,367

(22) Filed: Jan. 25, 2017

(51) Int. Cl.
*H01L 23/00* (2006.01)
*H01L 23/66* (2006.01)
*H01L 23/367* (2006.01)
*H01L 21/768* (2006.01)

(52) U.S. Cl.
CPC ........ *H01L 23/66* (2013.01); *H01L 21/76838* (2013.01); *H01L 23/367* (2013.01); *H01L 2223/6627* (2013.01); *H01L 2223/6683* (2013.01)

(58) Field of Classification Search
CPC .................................................... H01L 23/66
See application file for complete search history.

(56) References Cited

PUBLICATIONS

Harper et al., "Additive Manufacturing Applications in Electronic Packaging;" Proceedings of the Student Research Symposium, University of Massachusetts Lowell, Lowell, MA, Apr. 19, 2016; 1 Page.
Harper et al., "Printed Interconnects between Components for Microwave Applications;" University of Massachusetts Lowell, Lowell, MA; 1 Page.
Tehrani et al., "Inkjet-printed 3D interconnects for millimeter-wave system-on-package solutions;" 2016 IEEE MTT-S International Microwave Symposium (IMS), San Francisco, CA, 2016; 4 Pages.
Bijan K. Tehrani, Benjamin S. Cook, Manos M. Tentzeris, Inkjet-Printed 3D Interconnects for Millimeter-Wave System-on-Package Solutions, School of Electrical and Computer Engineering, George Institute of Technology, Atlanta, Georgia, Kilby Labs, Texas Instruments, Dalas, Texas, 2016, IEEE 4 pages.
Elicia Harper, et al., Additive manufacturing Applications in Electronic Packaging (presentation, Student Research Symposium, University of Massachusetts Lowell, Lowell, MA, Apr. 19, 2016) 1 page.

*Primary Examiner* — William Harriston
(74) *Attorney, Agent, or Firm* — Daly, Crowley, Mofford & Durkee, LLP

(57) ABSTRACT

A structure having pair of structure members separated by a gap and an interconnect structure member disposed in the gap. The interconnect structure member includes: a fill-structure having opposing sides in direct contact with the opposing sides of the first structure member and the second structure member; and, an interconnecting microwave transmission line disposed on the fill-structure electrically interconnecting the microwave transmission line of the first structure member to the second member structure. An electrically conductive member is disposed over a signal line of, and electrically connected to the ground conductor the interconnecting microwave transmission.

19 Claims, 21 Drawing Sheets

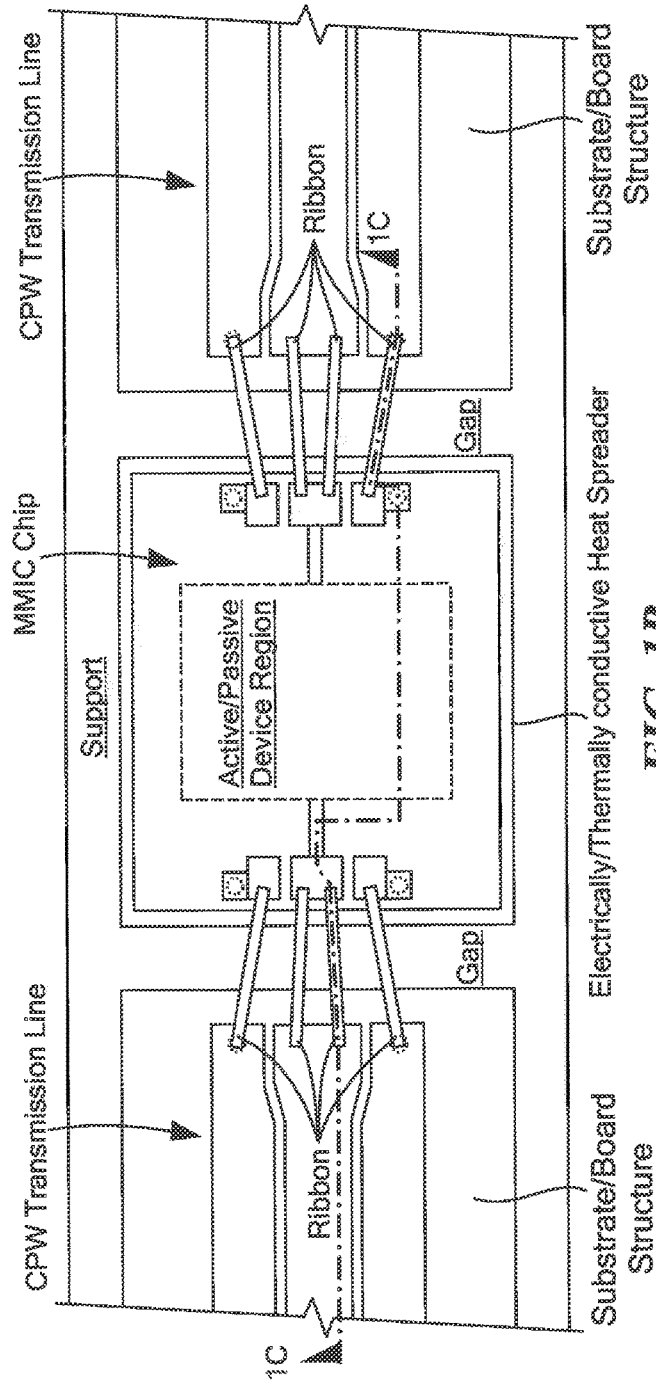
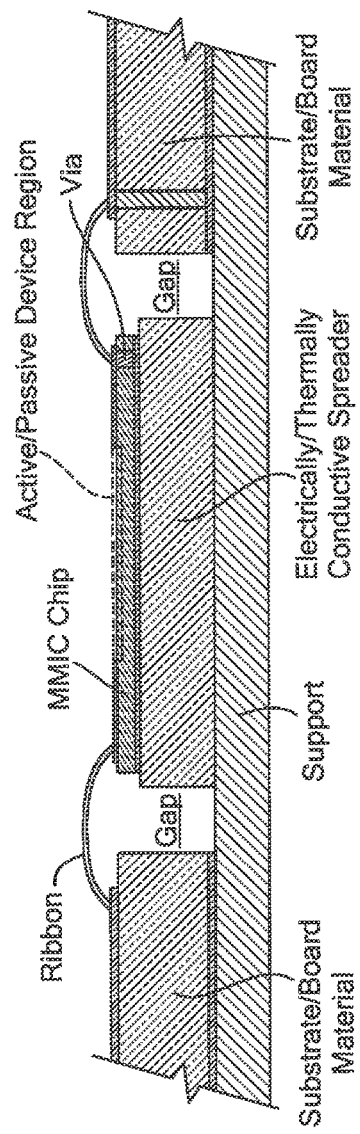
FIG. 1B PRIOR ART
FIG. 1C PRIOR ART

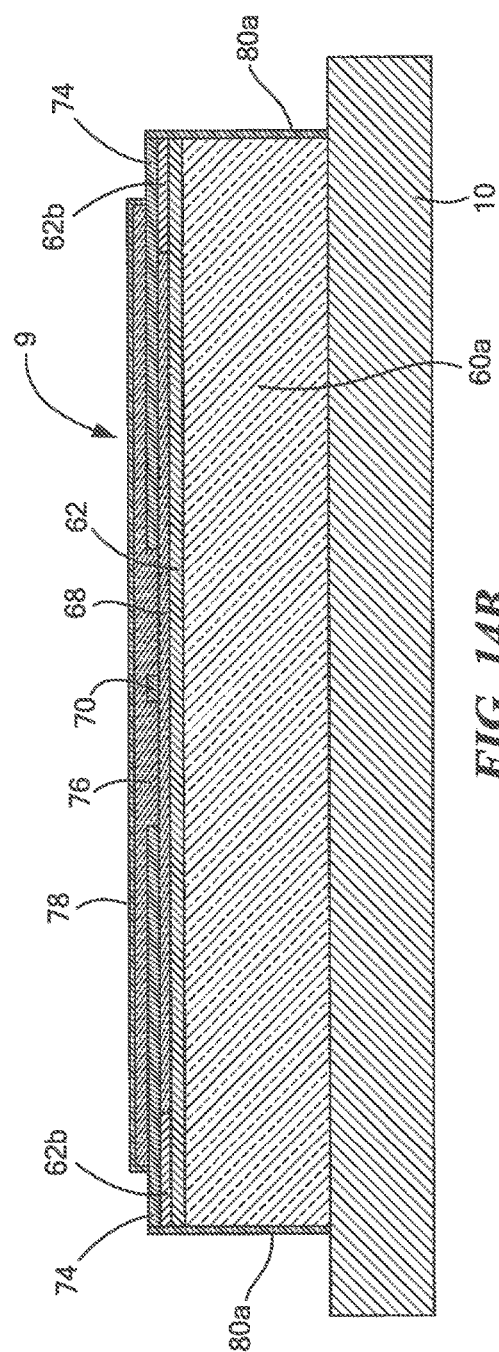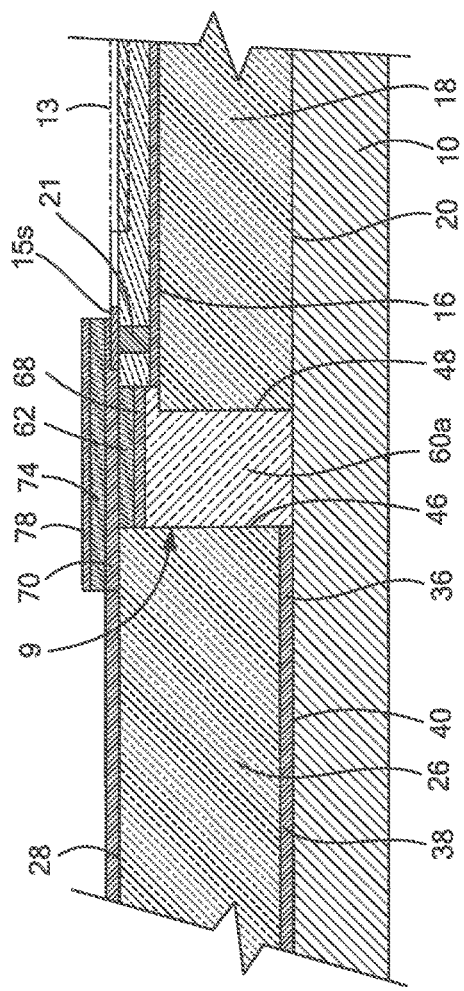

INTERCONNECT STRUCTURE FOR ELECTRICAL CONNECTING A PAIR OF MICROWAVE TRANSMISSION LINES FORMED ON A PAIR OF SPACED STRUCTURE MEMBERS

TECHNICAL FIELD

This disclosure relates generally to interconnect structures and more particularly to interconnect structure for electrical connecting a pair of microwave transmission lines formed on a pair of spaced structure members.

BACKGROUND

As is known in the art, it is frequently required to connect a microwave transmission line formed on one structure to a microwave transmission line formed on a second structure. For example, one structure may be a printed circuit board having coplanar waveguide (CPW) or microstrip transmission lines and the other structure may be a monolithic integrated circuit (MMIC) chip having active and passive devices interconnected with microwave transmission lines. In some applications, one or both structures may be printed circuits or one or both may be MMICs. In any event, the microwave transmission line at the output of one of the pair of structures may be required to be electrically connected to the microwave transmission line at the input of the other structure.

As is also known in the art, because of: Mismatched difference in the Coefficient of Thermal Expansion (CTE) of the two substrates, the two structures are mounted with a small gap, typically 5-15 mils, between them to prevent stress that can crack or damage the devices on the MMIC chip; Automatic assembly techniques typically place the two structures to a specific true position with some level of accuracy; however; there is a placement tolerance on the vision accuracy and the accuracy of placement due to motors, linear encoders, etc., in addition to allowing for substrate size tolerances on the structures; minimum gaps may also have to be created to meet assembly tool in automatic assembly apparatus such as pick and place collets (where flat face tools cannot be used), wire and ribbon bonding tools and dispense tools that all have their own specific access requirements. Therefore, one technique used to solve these problems is to place the opposing sides of the two structures as close together as possible and then use, as the electrical interconnect, wire or ribbon bonds, as shown in FIGS. 1A, 1B and 1C.

As is also known in the art, in many applications it is required to isolate the electrical interconnect from radiating to other parts of the circuit or being influenced by signal from another part of the circuit. As noted above, a traditional method for interconnecting is by wire or ribbon bonds; however, wire bonds are notorious for radiating signal. Further, if only the signal conductor is bonded, there is a very large amount of microwave radiation emitted from the bond. If ground signal ground bonds are used (as shown in FIGS. 1A-1C), the radiation is reduced but is still fairly strong and may be unacceptable in many applications and therefore, depending on the application, this can cause undesirable feedback oscillations or feedback induced ripple.

SUMMARY

In accordance with the present disclosure, a structure is provided having: a pair of structure members separated by a gap, each one of the pair of structure members having a microwave transmission line; and an interconnect structure disposed in the gap. The interconnect structure includes: a fill-structure having opposing sides in direct contact with the opposing sides of a first one of the pair of structure members and a second one of the pair of structure member; and, an interconnecting microwave transmission line disposed on the fill-structure electrically interconnecting the microwave transmission line of the first one of the pair of structure members to the microwave transmission line of the second one of the pair of structure members.

In one embodiment, the interconnect structure includes an electrically conductive member disposed over a signal line of the interconnecting microwave transmission.

With such an arrangement, the electrically conductive member shields microwave signals to prevent them from radiating to other parts of the circuit or being influenced by signal from another part of the circuit.

In one embodiment, the interconnect structure includes an electrically conductive layer disposed between the fill-structure and the interconnecting microwave transmission line.

In one embodiment, the interconnecting microwave transmission line includes a signal conductor and a ground conductor and wherein the electrically conductive member is electrically connected to the ground conductor.

In one embodiment, the interconnect structure includes an electrically conductive layer disposed between the fill-structure and the interconnecting microwave transmission line and wherein the conductive layer is electrically connected to the electrically conductive member and to the ground conductor.

In one embodiment, the electrically conductive member is disposed over the signal conductor, and connected to, the ground conductor to form a ground shield around the signal line so that the interconnect structure becomes, in effect, a shielded transmission line.

In one embodiment, the interconnect structure includes an electrically conductive layer disposed between the fill-structure and the interconnecting microwave transmission line and wherein the conductive layer is electrically connected to the electrically conductive member and to the ground conductor.

In one embodiment, the interconnect structure includes a dielectric layer disposed between the electrically conductive layer and the interconnecting microwave transmission line.

In one embodiment, an electrical conductor is disposed on a bottom of the interconnect structure and wherein the electrically conductive member is electrically connected to the electrical conductor disposed on the bottom of the interconnect structure.

In one embodiment, the electrical conductor disposed on the bottom of the interconnect structure comprises a heat spreader.

In one embodiment, an electrical interconnecting layer is disposed on outer sides of the fill material to electrical connect the conductor disposed on the bottom of the interconnect structure to the electrically conductive member.

In one embodiment, a method is provided for forming a structure, comprising: providing a pair of structure members on a support, with the pair of structure members being separated by a gap, each one of the pair of structure members having a microwave transmission line; and providing an interconnect structure in the gap, the interconnect structure being formed by a method comprising: forming a fill-structure comprising disposing a viscous material in the gap with such viscous material flowing in the gap to fill the gap and flowing in direct contact with the opposing sides of a first one of the pair of structure members and a second one of the pair of structure member; and, forming an interconnecting microwave transmission line on the fill-structure electrically interconnecting the microwave transmission line of the first one of the pair of structure members to the microwave transmission line of the second one of the pair of structure members.

In one embodiment, the method includes forming an electrically conductive member disposed over signal line of the interconnecting microwave transmission.

In one embodiment, the interconnecting microwave transmission line is printed by dispense, jet or filament onto the fill-structure.

In one embodiment, the method includes forming by dispense, jet or filament a dielectric layer over signal line of the interconnecting microwave transmission line.

In one embodiment, the electrically conductive member is printed by dispense, jet or filament over the dielectric layer.

In one embodiment, a method for forming a structure, comprising: providing a pair of structure members on a support, with the pair of structure members being separated by a gap, each one of the pair of structure members having a microwave transmission line; forming an interconnect structure in the gap using entirely 3D printing.

With such an arrangement, an interconnect structure is provided that shields microwave signals to isolate them from radiating to other parts of the circuit or being influenced, by signal from another part of the circuit. Further, the fill-material serves as a "pillow" or "pedestal" to provide a surface for using additive writing techniques, such as printing, in forming the interconnecting microwave transmission line disposed thereon. The "pillow" provides structural support and in some cases may also be the dielectric separating a ground conductor of the interconnecting microwave transmission line from a ground conductor under the "pillow". Conductive ink or filament is used to connect ground shield, over the signal line of the interconnecting microwave transmission line, around one or more signal lines of the interconnecting microwave transmission line that are also written with conductive ink or filament. A controlled thickness dielectric ink, film or filament separates the ground conductor of the interconnecting microwave transmission line from signal conductor of the ground conductor of the interconnecting microwave transmission line. The "pillow" also provides mechanical stability prior to printing. Thus, in situ printed signal and ground conductors of the interconnecting microwave transmission line replace the wire/ribbon bonds used in the prior art.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIG. 1B is a sketch of a plan view of the structure of FIG. 1A according to the PRIOR ART;

FIG. 1C is a sketch of a cross-sectional view of the structure of FIGS. 1A and 1B, such cross-section being taken along line 1C-1C in FIG. 1B according to the PRIOR ART;

FIGS. 2A, 2B through 13A, 13B are sketches of perspective, plan, and cross-sectional views of a structure having three structure members separated by gaps and electrically interconnected with an interconnect structure member at various stages in the fabrication thereof according to the disclosure; FIG. 2B being a cross-sectional view taken along line 2B-2B in the perspective view of FIG. 2A; FIGS. 13B being cross-sectional views taken along lines 13B-13B, respectively in the perspective view of FIG. 13A.

FIGS. 14A, 14B and 14C are plan and cross-sectional views of a portion of the structure formed in accordance with FIGS. 2A, 2B through 13A, 13B, such portion showing the interconnection between two of the three structure members, the cross-sections in FIGS. 14B and 14C being taken along lines 14B-14B and 14C-14C, respectively in the plan view FIG. 14A.

Like reference symbols in the various drawings indicate like elements.

DETAILED DESCRIPTION

Figure 1A:
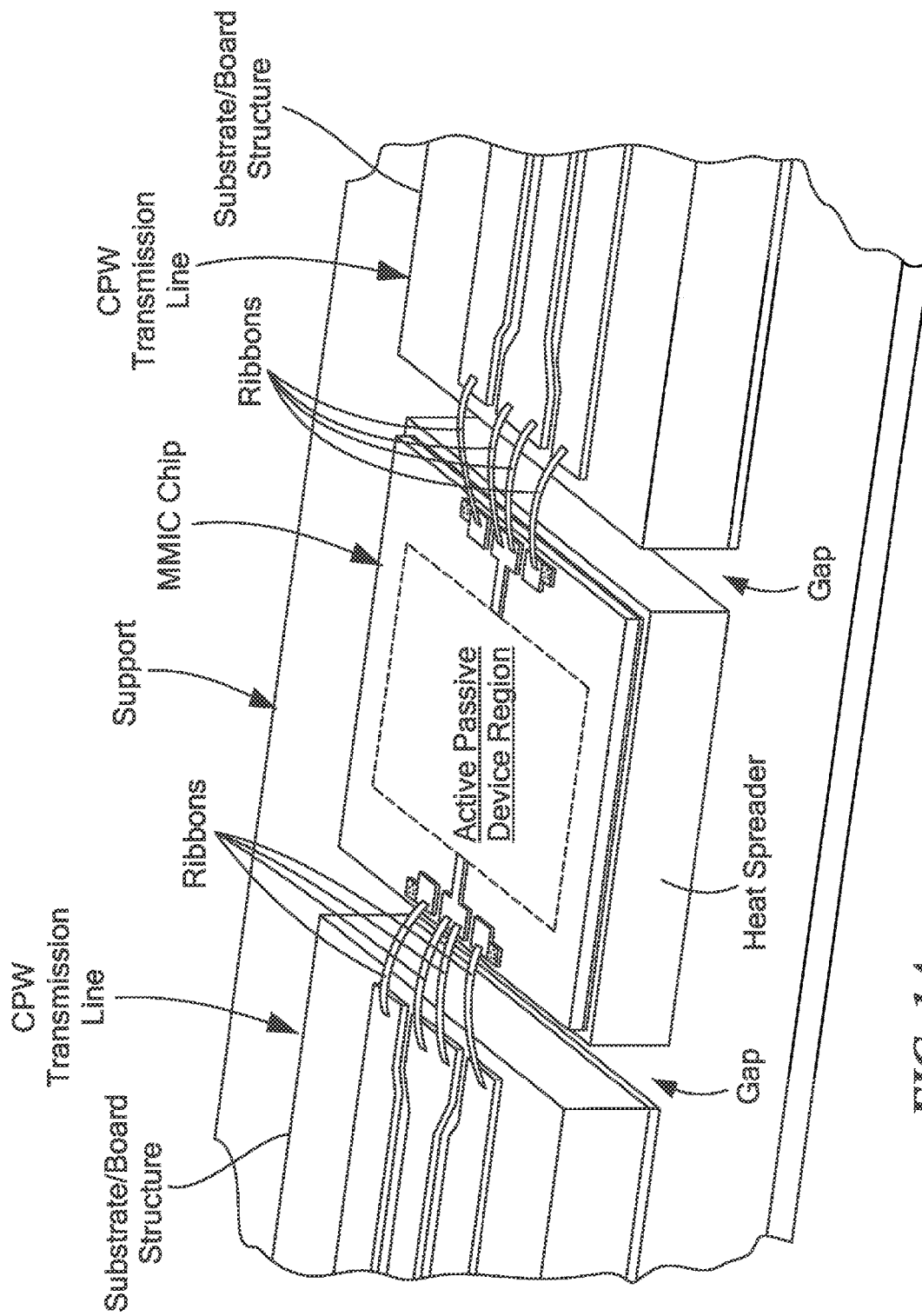
FIG. 1A is a sketch of a perspective view of a structure having three structure members separated by gaps and electrically interconnected with electrically conducive ribbons bridging the gaps according to the PRIOR ART.

Referring now to FIGS. 2A, and 2B through 13A and 13B, a process is shown for forming an interconnect structure 9 (FIGS. 14A, 14B) connecting pairs of microwave transmission lines formed on pairs of spaced structure members 12, 24 through an interconnecting microwave transmission line 75a (FIG. 10A) connecting the microwave transmission line 30 on structure member 24 to the chip 12 and an interconnecting microwave transmission line 75b connecting the chip 12 to the microwave transmission line 30 on a structure member 42.

Figure 2A:
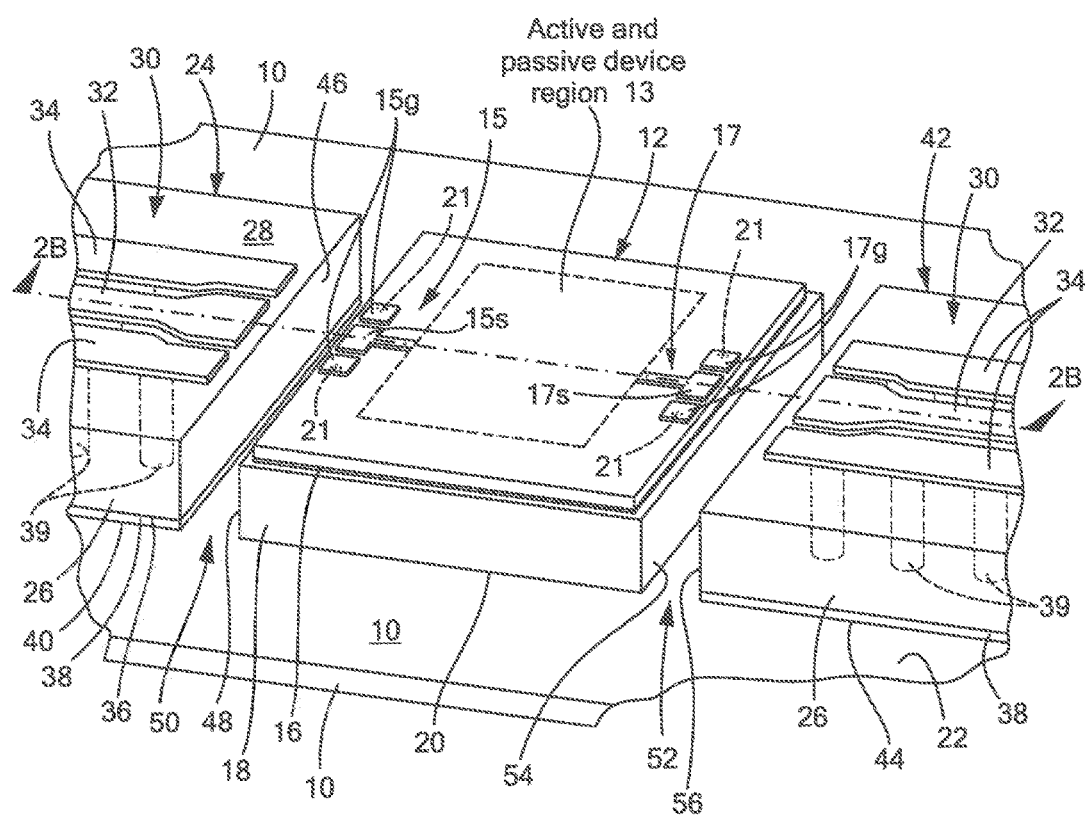
Figure 2B:
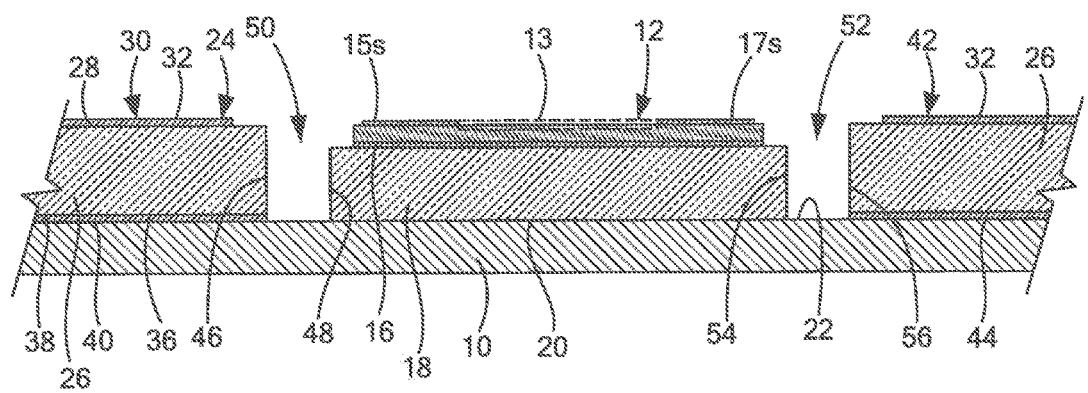

Thus, referring to FIGS. 2A and 2B, a support 10 is provided, here for example, an electrically and thermally conductive heat sink having a first structure member 12, here having, for example: a monolithic microwave integrated circuit (MMIC) chip 12 having an electrically and thermally conductive layer 16 on the bottom surface of the chip 12; and an electrically and thermally conductive heat spreader 18 affixed to a bottom surface of the electrically and thermally conductive layer 16. The bottom surface of the heat spreader 18 is affixed to a first portion 20 of an upper surface 22 of the support 10 by any convenient means, here for example by solder.

The MIMIC chip 12 has an active and passive device region 13 connected to input and output microwave transmission lines 15, 17, respectively, here for example a microstrip lines, as shown. The input microstrip transmission line 15 has an input signal pad 15s disposed between a pair of input ground pads 15g; the input ground pads 15g being connected to the heat spreader 18 by conductive vias 21 passing vertically through the MMIC chip 12, as indicated. The output microstrip transmission line 17 has an input signal pad 17s disposed between a pair of output ground pads 17g; the output ground pads 17g being connected to the heat spreader 18 by the conductive vias 21 passing vertically through the MMIC chip 12, as indicated A second structure member 24, here for example a dielectric substrate 26, such as a printed circuit board having: on an upper surface 28 thereof, a microwave transmission line 30, here, for example, coplanar waveguide (CPW) transmission line having a center, signal conductor 32 disposed between a pair of ground plane conductors 34; and, on a bottom surface 36 thereof, an electrically conductive layer 38, the electrically conductive layer 38 being electrically connected to the pair of ground plane conductors 34 by electrically conductive vias 39 passing vertically through the dielectric substrate 26, here for example, alumina, as shown; the electrically conductive layer 38 is affixed to a second portion 40 of the upper surface 22 of the support 10 by any convenient means, here for example by solder. More particularly, the conductive vias 39 are disposed along the length of each one of the ground plane conductors 34 and are spaced one from another about $\lambda/8$, where $\lambda$ is the nominal operating wavelength of the microwave energy being transmitted through the transmission line 30.

Here, a third structure member 42 is provided. The third structure member 42 is identical to the second structure member 24 and is affixed to a third portion 44 of the upper surface 22 of the support 10 by any convenient means, here for example by solder, as shown. It is noted that opposing or facing, sides 48, 46 of the first structure member 12 and the second structure member 24, respectively, are separated by a first gap 50 and that opposing or facing sides 54, 56 of the second structure member 24 and the third structure member 42, respectively, are separated by a second gap 52.

Figure 3A:
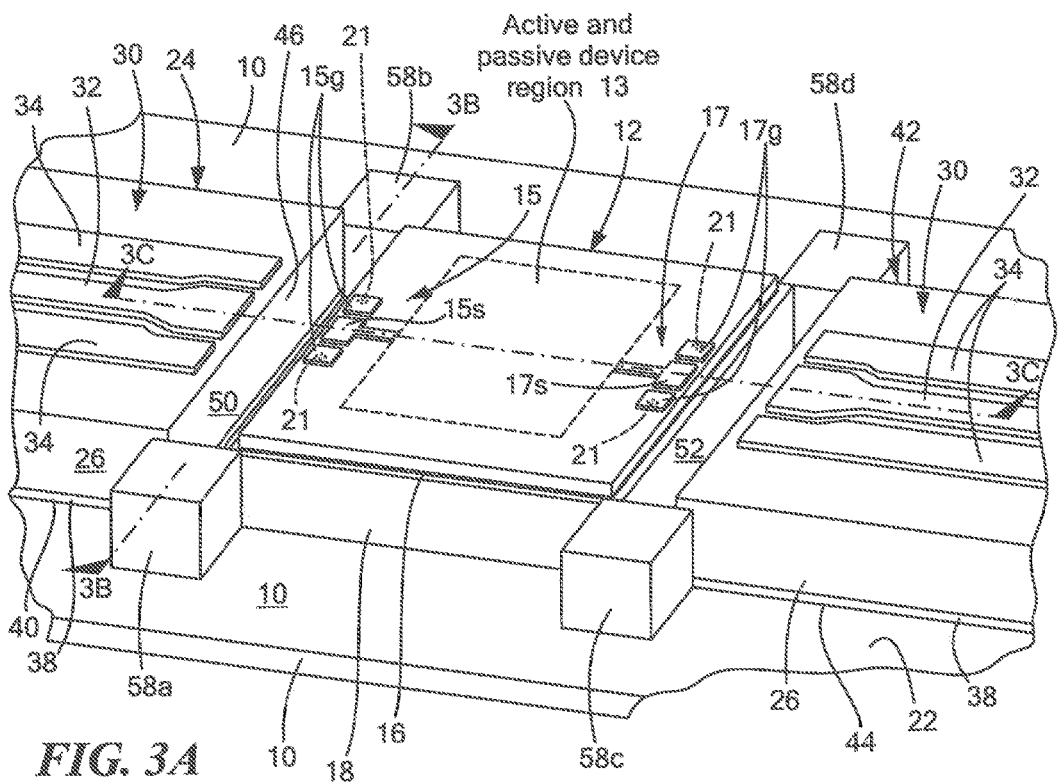
Figure 3B:
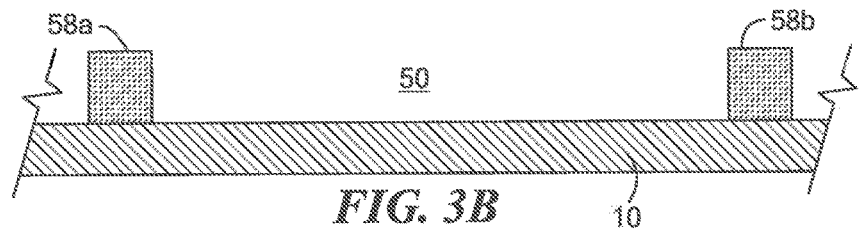
FIGS. 3B and 3C being cross-sectional views taken along lines 3B-3B and 3C-3C, respectively in the perspective view of FIG. 3A.
Figure 3C:
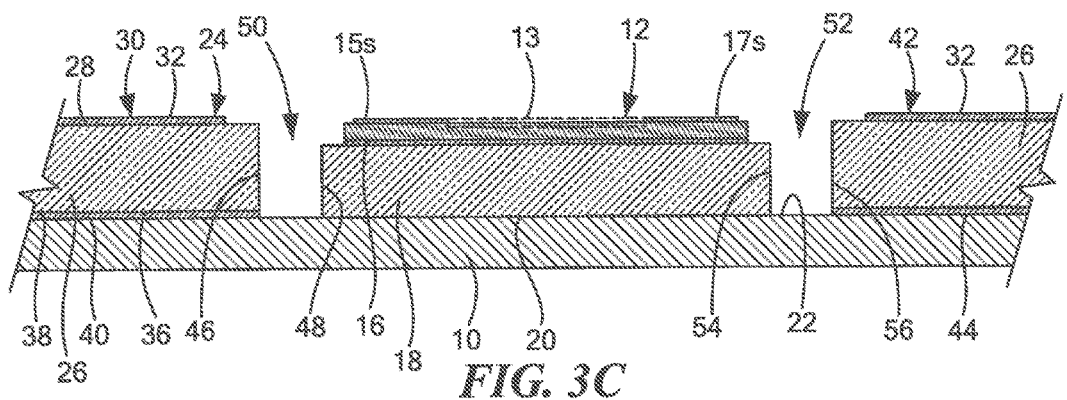

Next, referring to FIGS. 3A, 3B and 3C, an optional dam material 58, here for example silicone, is applied, using a syringe or 3D printing process, to portions of the upper surface 22 of the support 10 to provide four dams 58a-58d; two dams, 58a, 58b at the opposing ends of the first gap 50 and two 58c, 58d at the opposing ends of the second gap 52, as shown. After applying the dam material 58 as shown, the dam material 58 is cured. Here, in this example, the height of the dams 58a-58d is at approximately the height of the heat spreader 18.

Figure 4A:
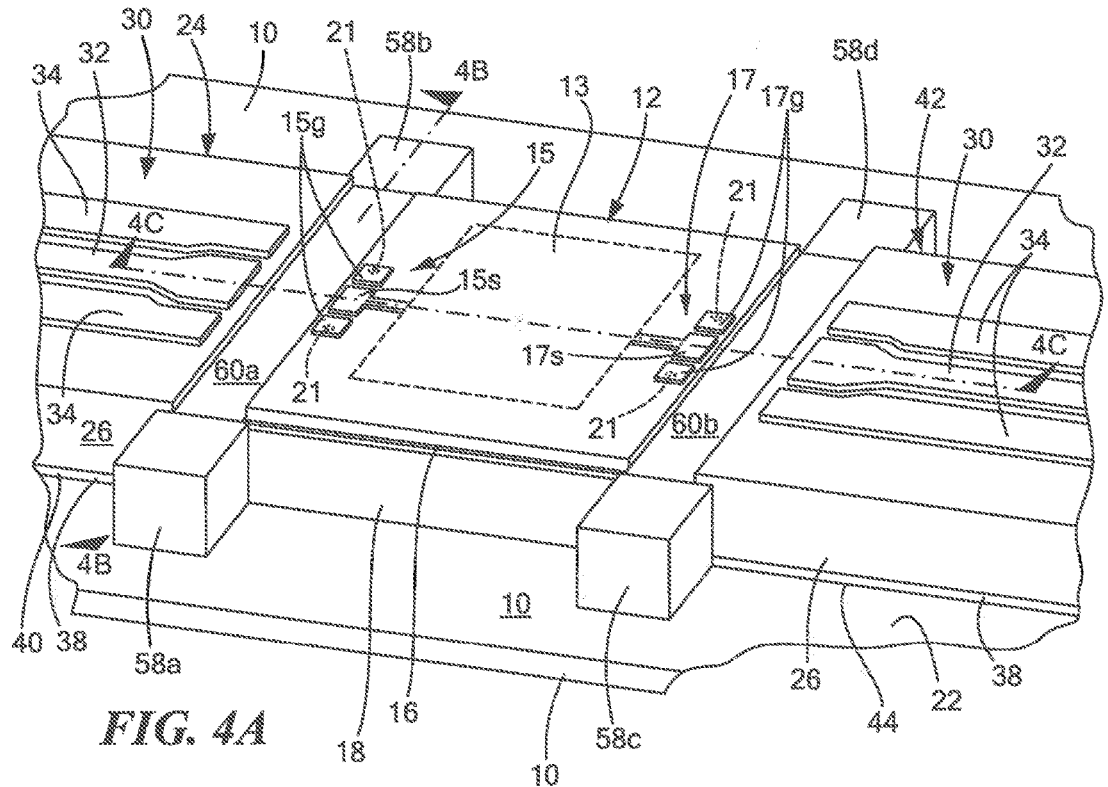
Figure 4B:
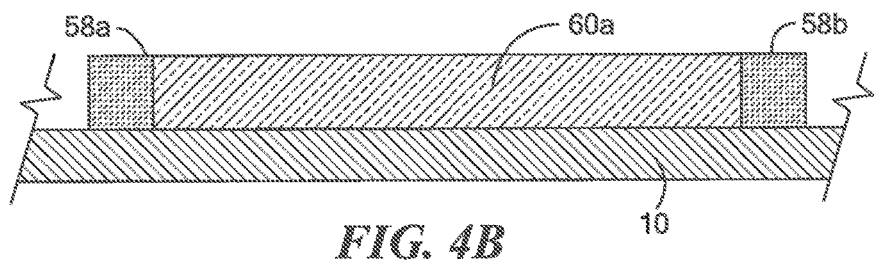
FIGS. 4B and 4C being cross-sectional views taken along lines 4B-4B and 4C-4C, respectively in the perspective view of FIG. 4A.
Figure 4C:
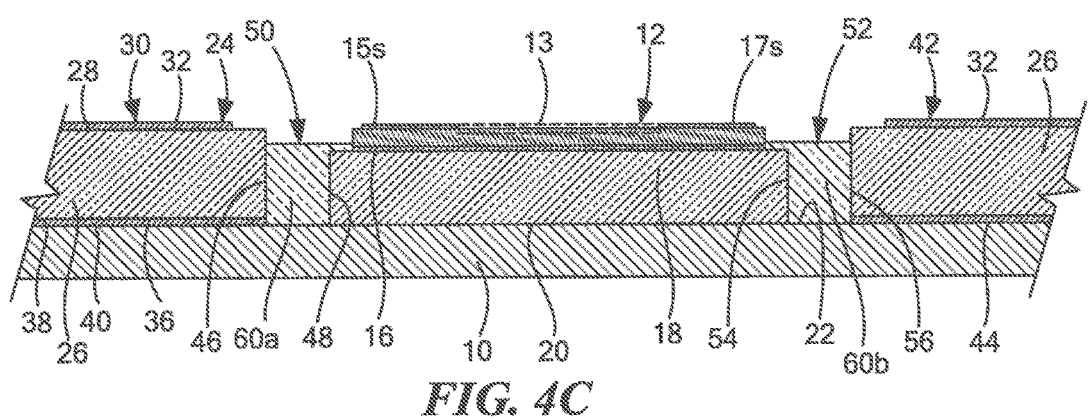
Figure 5:
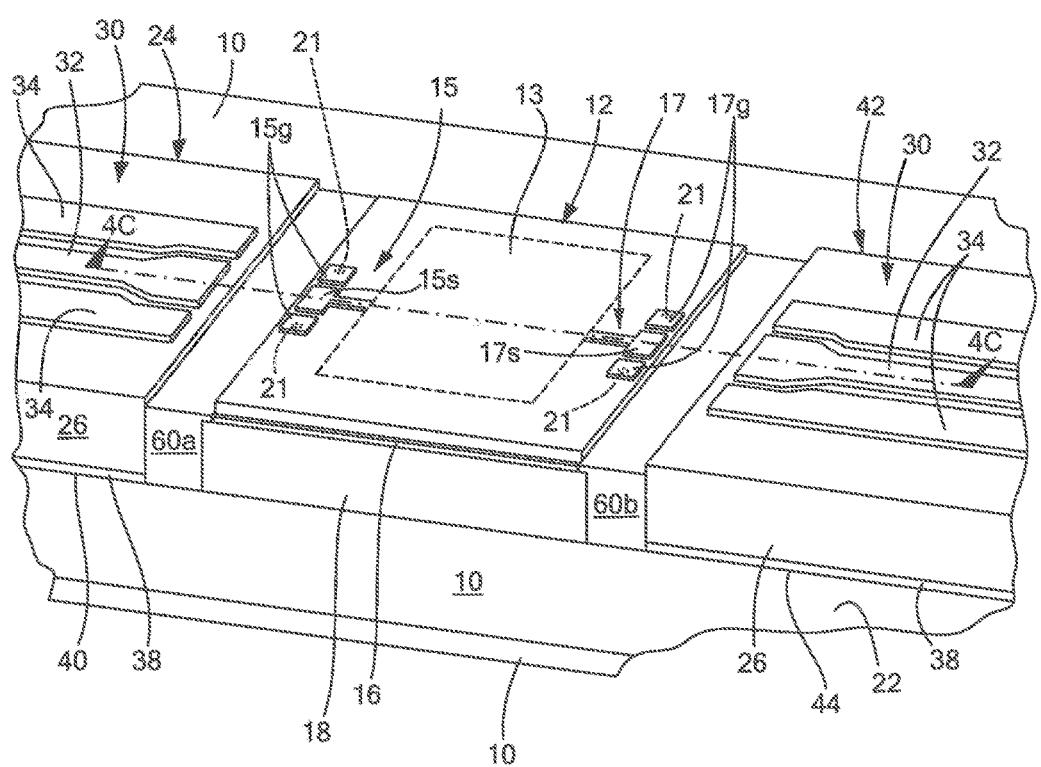

Next, referring to FIGS. 4A, 4B and 4C, a pair of fill-structures 60a, 60b is formed in each of the gaps 50, 52, respectively, as shown, and between the pairs of dams 58a, 58b and 58c, 58d, respectively, as shown, using a syringe or 3D printing process to, here in this example, the height of the dams 58a-58d. The height of the fill-structures pair of fill-structures 60a, 60b depends on the dielectric properties of the next dielectric layers to be formed. The fill-structures 60a, 60b serve as a "pillow" or "pedestal" to provide a surface for using additive writing techniques, to be described, in forming the interconnecting microwave transmission lines 75a, 75b (FIG. 10A) disposed thereon. The fill-structures 60a, 60b are formed as for example by dispensing a viscous, insulating material with a Young's modulus chosen to handle the mismatched Thermal Coefficient of Expansions (TCEs) over the thermal range of interest, as for example, a silicone material. More particularly, for a given structure 9 (FIGS. 14A, 14B) adapted for operation over a temperature operating range $T_{OP}$ and a storage temperature range $T_{SR}$, the pair of fill-structures 60a, 60b have a Young's modulus selected so that, over the temperature range of both the temperature operating range $T_{OP}$ and a storage temperature range $T_{SR}$ of the structure 9, neither the interconnecting microwave transmission line 75a (FIG. 10A) nor the interconnecting microwave transmission line 75a fails, fractures or otherwise lose electrical connectivity. Fill-structure 60a is confined between the opposing or facing sides 46, 48 of the first structure member 12 and second structure member 24 (filling gap 50) and dams 58a, 58b and the fill-structure 60b is confined between the opposing or facing sides 54, 56 of the first structure member 12 and the third structure member 42 (filling gap 52) and dams 58c, 58d. The dams 58a-58d is used to prevent the fill-structure material from flowing out of the gaps 50, 52 before the fill-structure material has fully cured. After the fill-structure material is here planarized, and then fully cured, the optional dams 58a may be removed, as shown in FIG. 5, here, for example, using a razor blade. Note the dams 58a, 58b are typically used if the fill material 60a, 60b is a low viscosity self-leveling material; if a higher viscosity material is used, the dam 58a, 58b is not necessarily required. It should be understood that other methods may be used to form the fill-structures 60a, 60b, such using an insulating filament to fill the gaps 50 52.

Figure 6A:
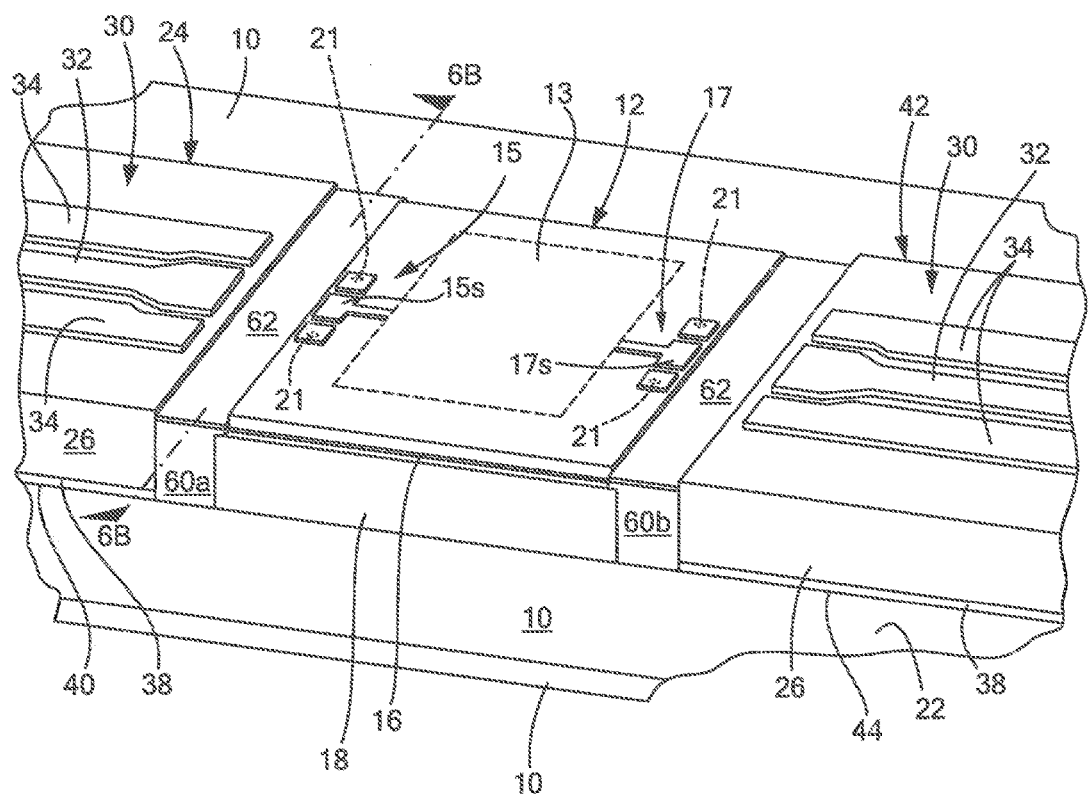
Figure 6B:
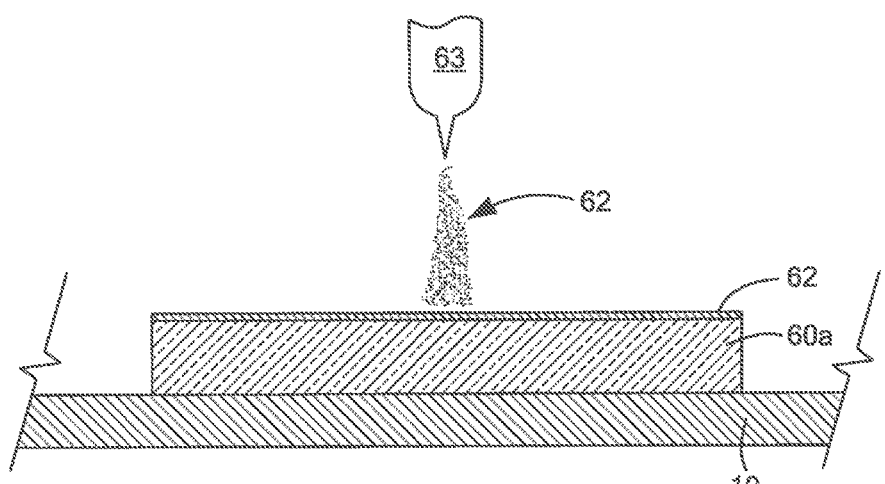
FIG. 6B being a cross-sectional views taken along lines 6B-6B in the perspective view of FIG. 6A.

Referring now to FIGS. 6A and 6B, an electrically conductive layer 62, here for example, an electrically conductive ink, for example silver or copper nanoparticle ink, is printed from above the fill-structures 60a, 60b using a printer 63 that can print the desired ink, here, for example, with an Optomec Aerosol printer, Optomec, 3911 Singer N.E. Albuquerque, N. Mex. 87109 onto the upper surface of the fill-structures 60a, 60b, as shown.

Figure 7A:
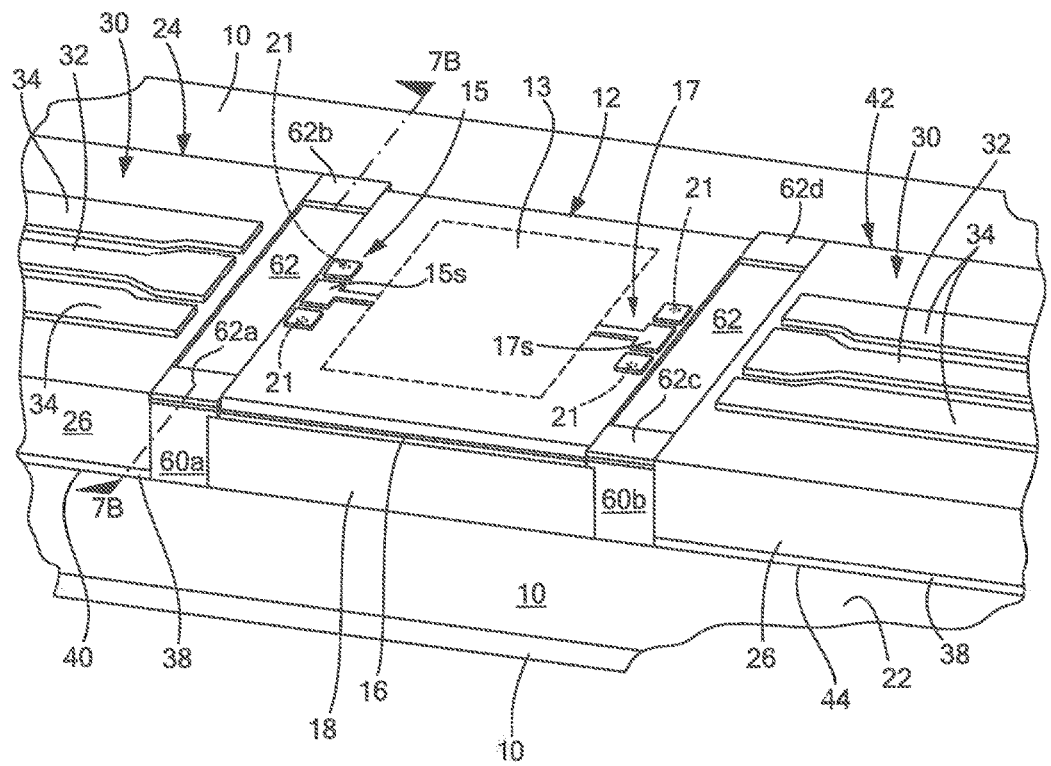
Figure 7B:
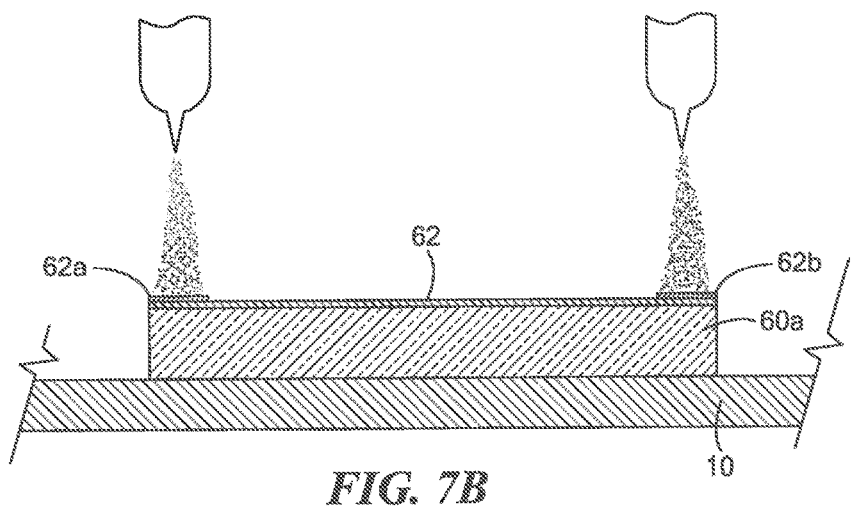
FIG. 7B being a cross-sectional views taken along lines 7B-7B in the perspective view of FIG. 7A.

Referring now to FIGS. 7A and 7B, the height of the electrically conductive layer 62 is built-up in height to form conductive pads 62a-62d, as shown, using additional electrically conductive ink and, for example, 3D printing, on the outer edge surface portions of the electrically conductive layer 62. The build-up is to enable the next electrically conductive ground lines 74 to be formed, as will be described in FIGS. 10A-10C, to electrically connect the layer 62 to layer 78. The conductive paste material used for layers 62, and 62a-62d and is then cured.

Figure 8A:
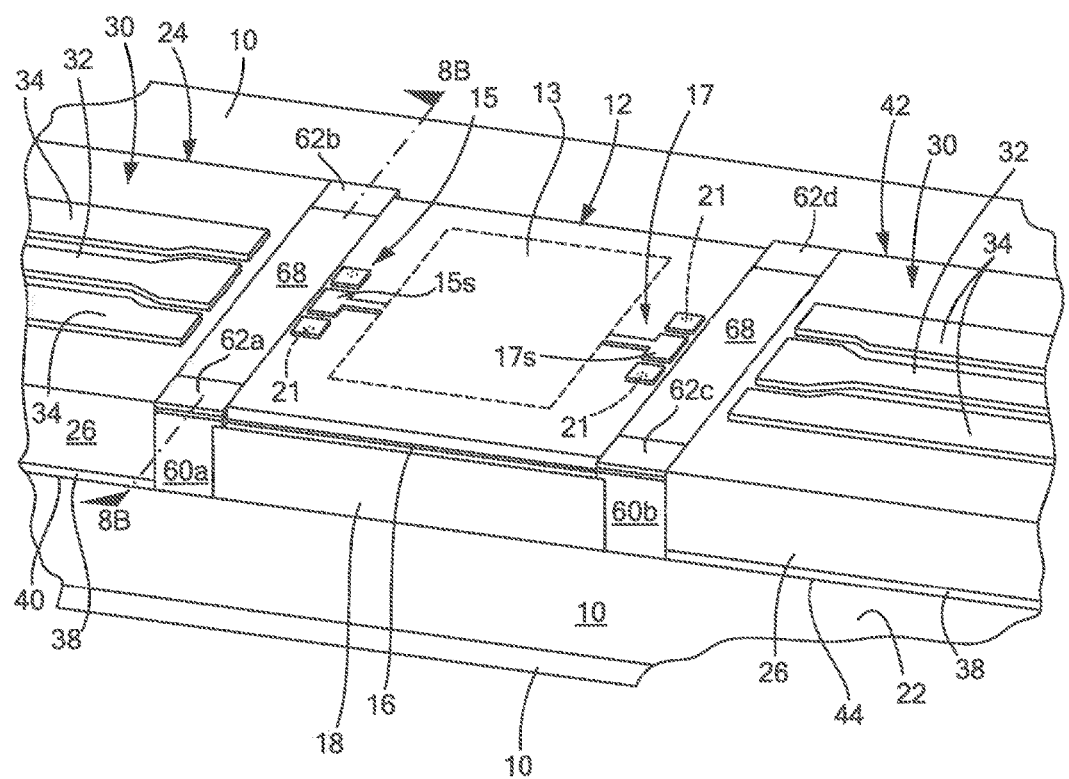
Figure 8B:
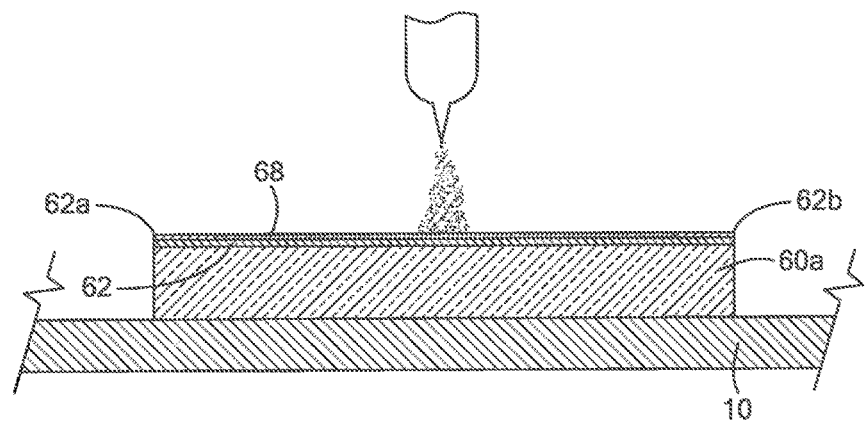
FIGS. 8B and 8C being cross-sectional views taken along lines 8B-8B and 8C-8C, respectively in the perspective view of FIG. 8A.
Figure 8C:
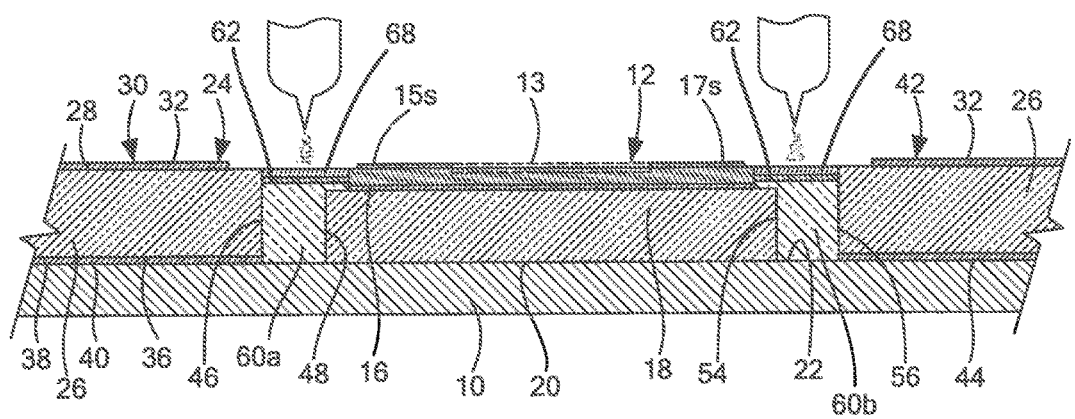

Referring now to FIGS. 8A-8C, after curing the electrically conductive ink material used for layers 62, 62a-62d and used for conductive layer 74, a first layer 68 of dielectric material, here, for example a polymer ink or filament suitable for a microwave dielectric, that is of controlled dielectric and loss tangent properties, such as Rogers Corporation, Rogers Conn. 06263 dielectric filaments, or Creative Materials, Ayer, Mass. 01432, inks, polyimide or epoxy based dielectrics formed using, for example 3D printing, to a height approximately level with the height of 62a-62d. This dielectric material is then cured.

Figure 9A:
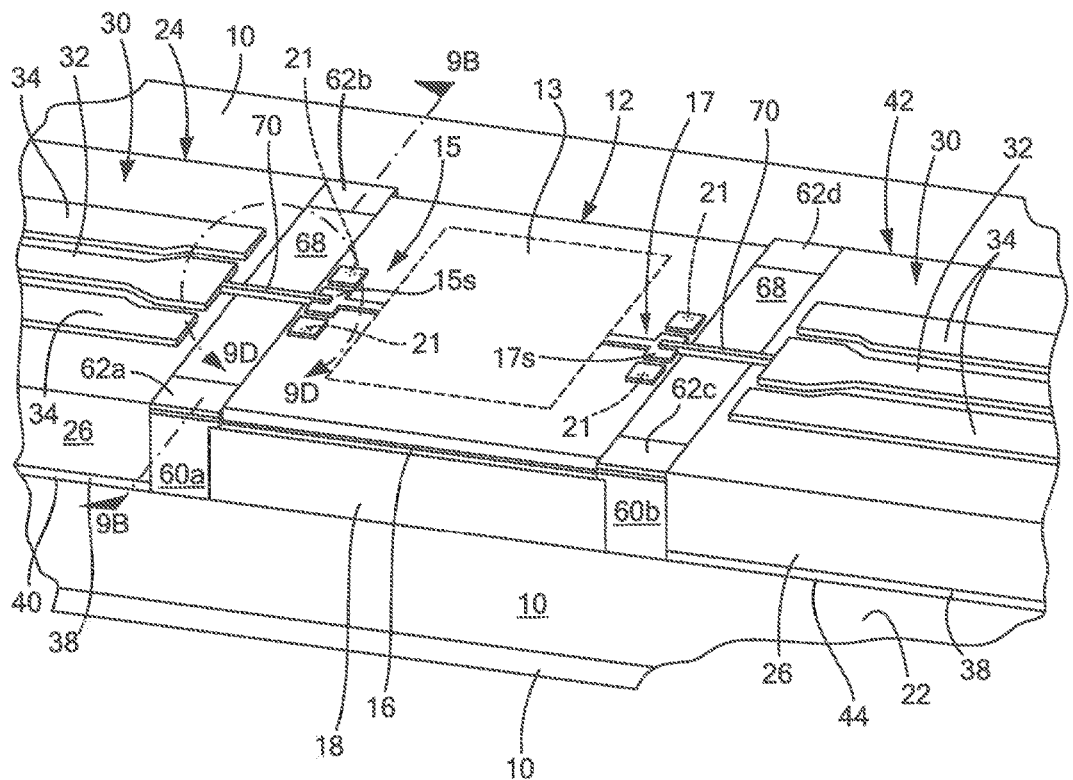
Figure 9B:
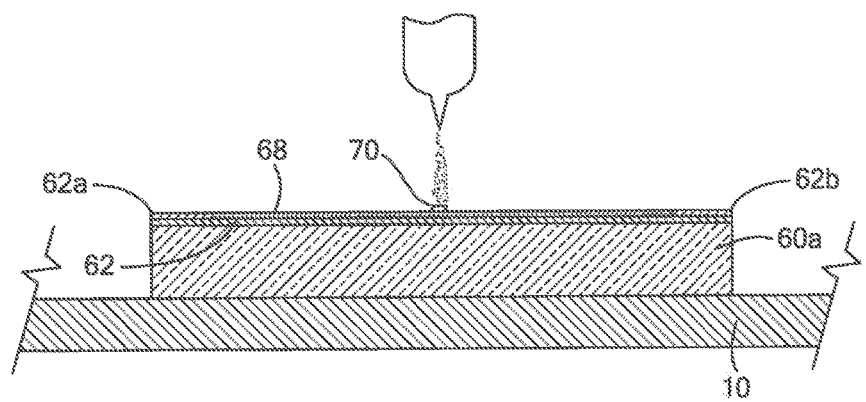
FIGS. 9B and 9C being cross-sectional views taken along lines 9B-9B and 9C-9C, respectively in the perspective view of FIG. 9A.
Figure 9C:
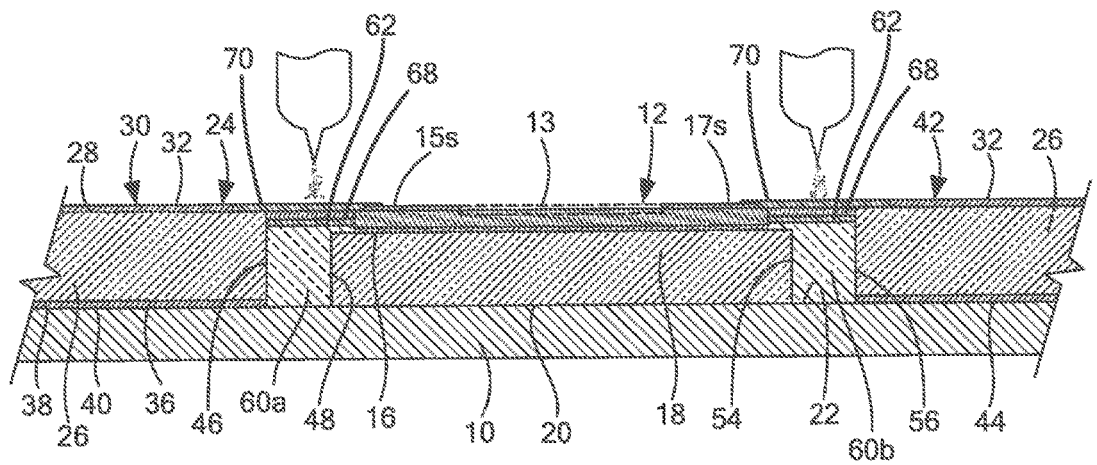
Figure 9D:
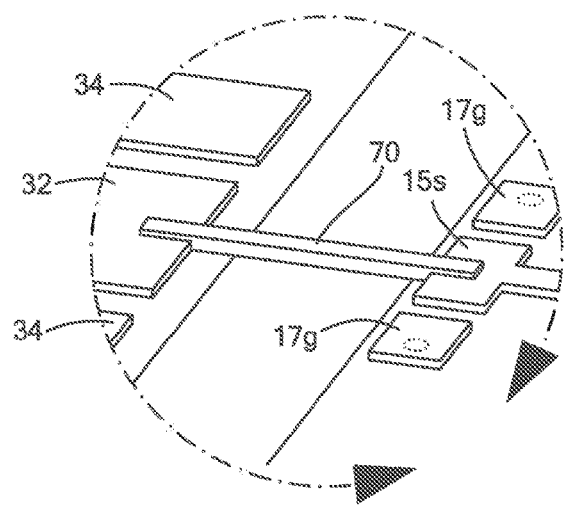

Referring now to FIGS. 9A-9C, signal lines 70 connecting the signal input pad 15s and signal output pad 17s of the MMIC chip 12 to the signal lines 32 of the CPW transmission lines 30, respectively, are printed on the dielectric layer 68, as shown, and is then subsequently cured or curing may be delayed until after the next step to be described in connection with FIGS. 10A-10C. The material used for the signal lines 70 is typically the same material as the material used for layers 62 and ground layer 74. This material can be cured along with the next step. It is noted that here the upper surface of dielectric 26 and chip 12 are at the same level and here the signal pads 15g, 17g are thinner than the signal conductor 32 and the ground plane conductors 34 so the signal lines 70 here abut the edges of the strip conductors 32 and overlay portions of the signal pads 15s, 17s; however, the signal lines 70 may overlap the ends of the strip conductors 32 as shown in FIG. 9D.

Figure 10A:
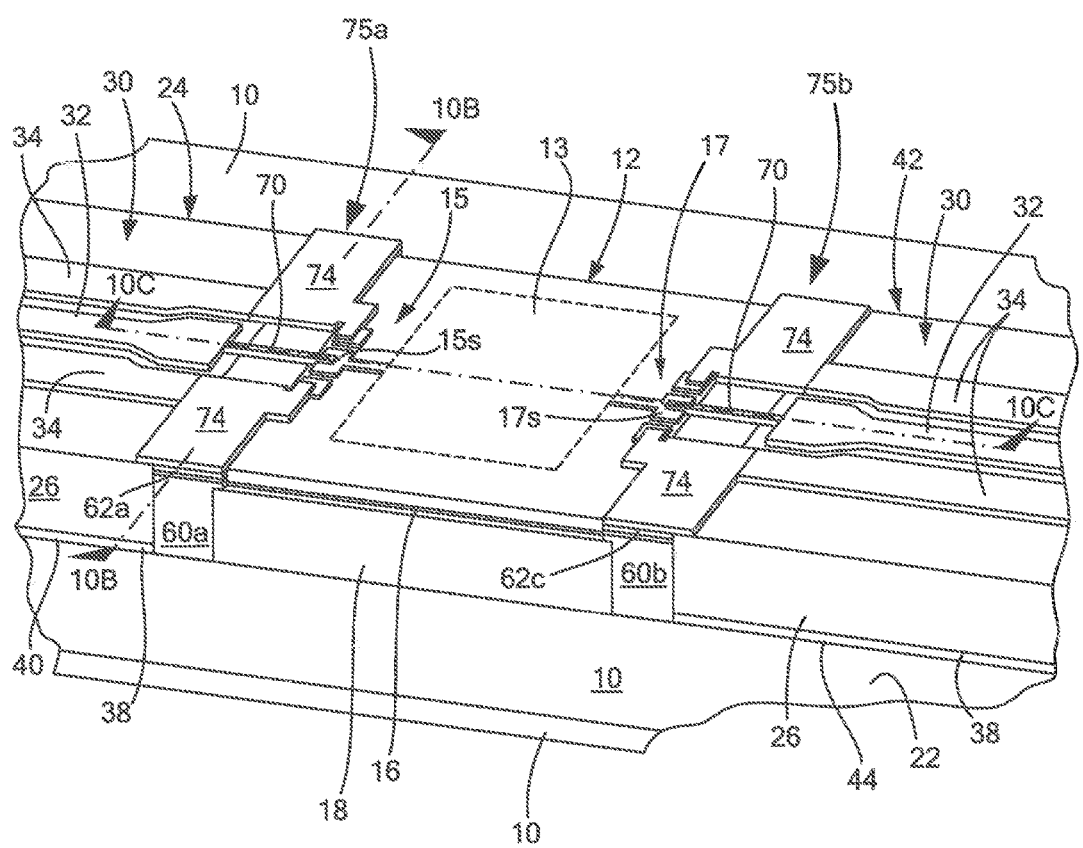
Figure 10B:
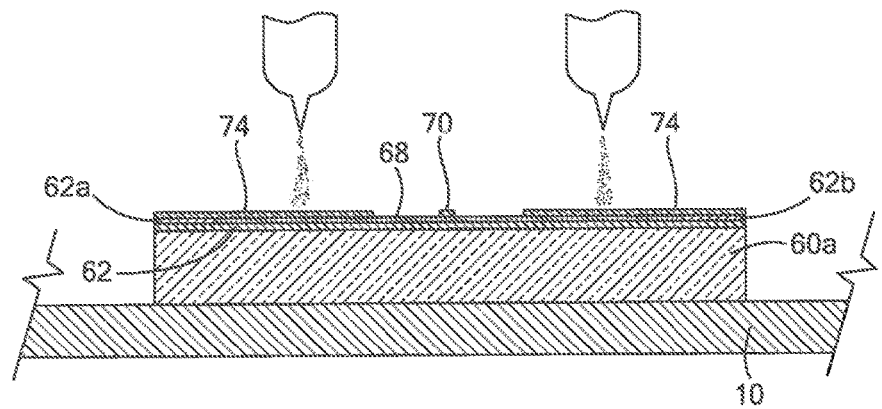
FIGS. 10B and 10C being cross-sectional views taken along lines 10B-10B and 10C-10C, respectively in the perspective view of FIG. 10A.
Figure 10C:
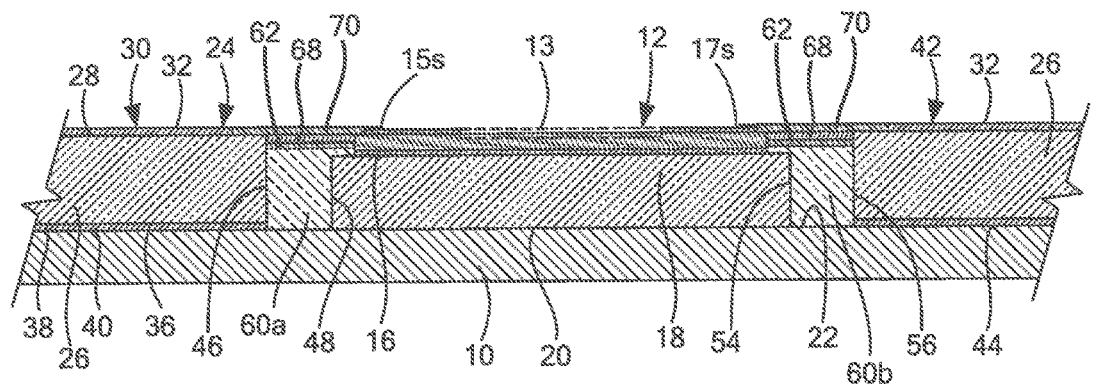

Referring now to FIGS. 10A-10C, ground lines 74, here of the same material as used to print the signal line 70 and 62, 62a-62d, are printed to connect the ground lines 21 on first structure member 12 to the ground lines 34 on the second and third structure members 24, 42 respectively, electrically connecting the MMIC chip 12 to the CPW transmission lines 30 on the first and third structure members 24, 42. As noted above, this material is then cured. It is noted from FIG. 10B that the ground lines 74 are dielectrically insulated from the signal line 70 by the dielectric layer 68 but are electrically connected to the electrically conductive layers 62, 62a and 62b, as well as 62c and 62d. It is also noted that, as described above, the upper surface of dielectric 26 and chip 12 are at the same level and here the ground pads 15g, 17g are thinner than the ground plane conductors 34 so the ground lines 74 here abut the edges of the ground plane conductors 34 and overlay portions of the ground pads 15g, 17g; however, the ground lines 74 may overlap the ends of the ground lines 34. Thus, the signal conductor 70 and ground lines 74 over fill-material 60a forms a microwave transmission line 75a (FIG. 10a) connecting the microwave transmission line 30 on the second structure member 24 to the chip 12 and the signal conductor 70 and ground lines 74 over fill-material 60b forms a microwave transmission line 75b (FIG. 10A) connecting the chip 12 to the microwave transmission line 30 on the third structure member 42.

Figure 11A:
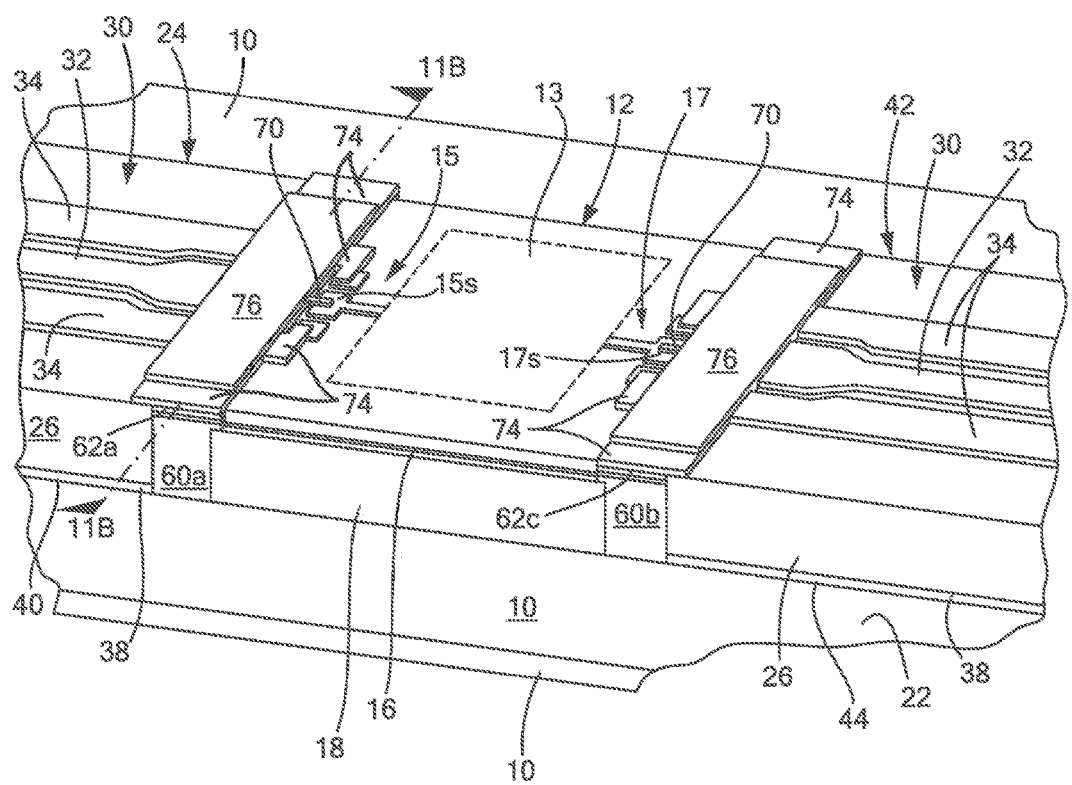
Figure 11B:
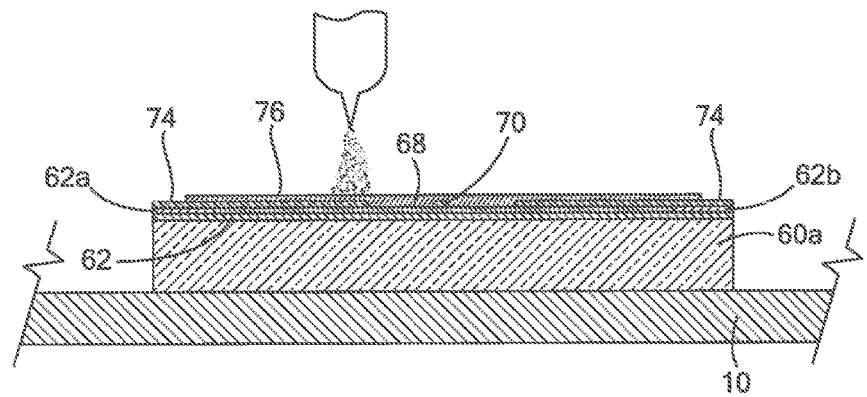
FIGS. 11B and 11C being cross-sectional views taken along lines 11B-11B and 11C-11C, respectively in the perspective view of FIG. 11A.
Figure 11C:
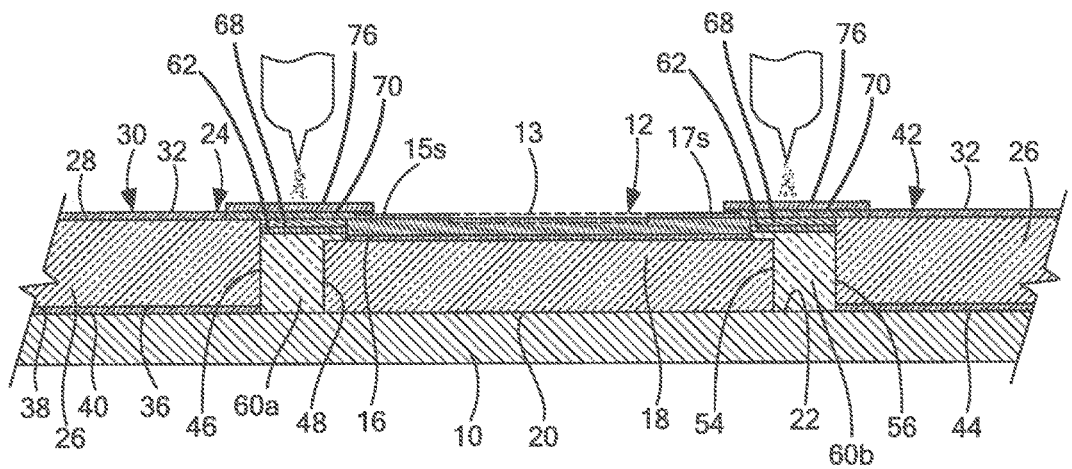

Referring now to FIGS. 11A-11C, after curing the materials used to form the signal line 70 and conductive ground layer 74, a layer 76 of dielectric material that is the same as the dielectric material 68, here an epoxy based ink, is 3D printed over the conductive ground layer 74, exposed portions of the dielectric layer 68, as shown. This dielectric material of layer 76 is then cured.

Figure 12A:
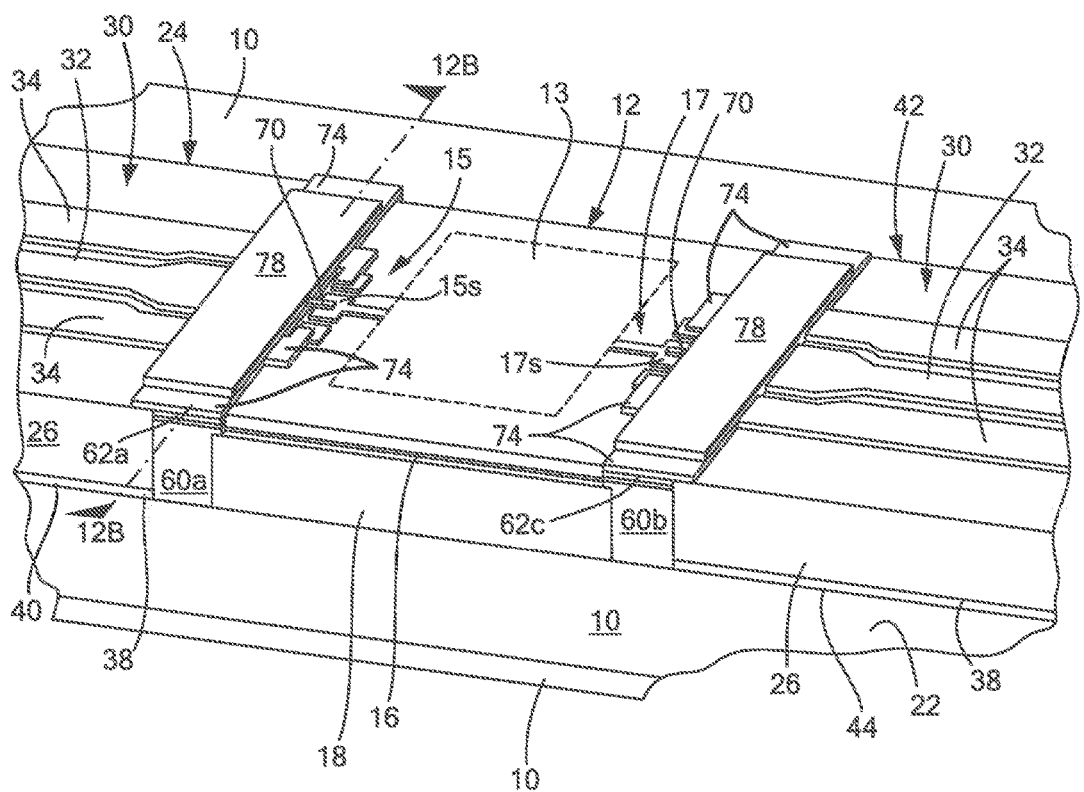
Figure 12B:
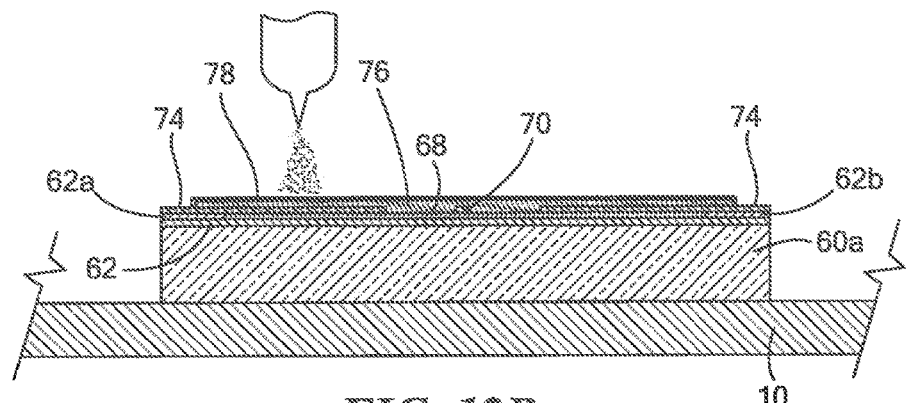
FIGS. 12B and 12C being cross-sectional views taken along lines 12B-12B and 12C-12C, respectively in FIG. 12A.
Figure 12C:
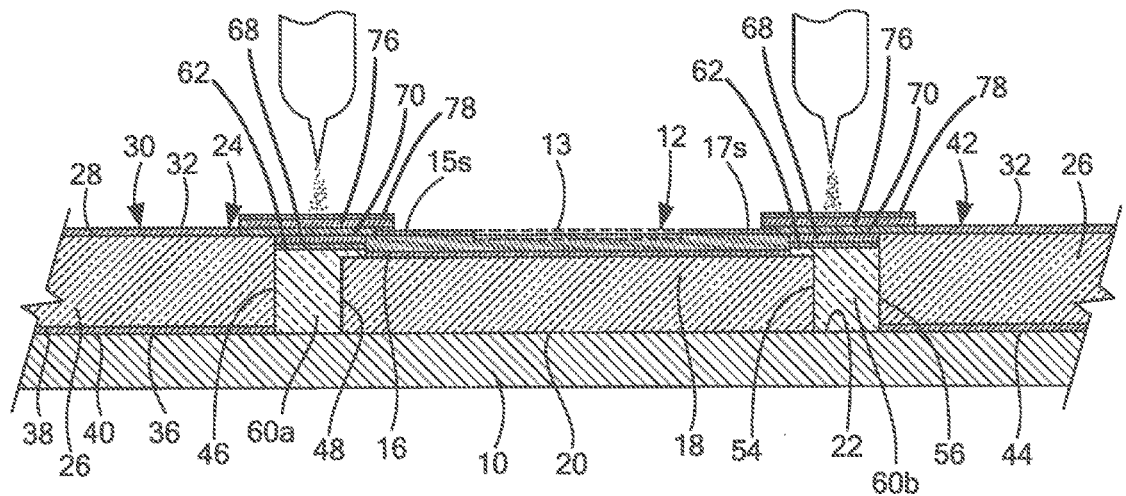

Referring now to FIGS. 12A-12C, a ground shield layer 78 is formed as an electrically conductive shielding member, here printed over the top surface and sidewalls of dielectric layer 76, as shown, to electrically interconnect the ground shield layer 78 to layers 62, 62a-62d, and 74. This material can be cured after printed or after the next step to be described in connection with FIGS. 13A-13B.

Figure 13A:
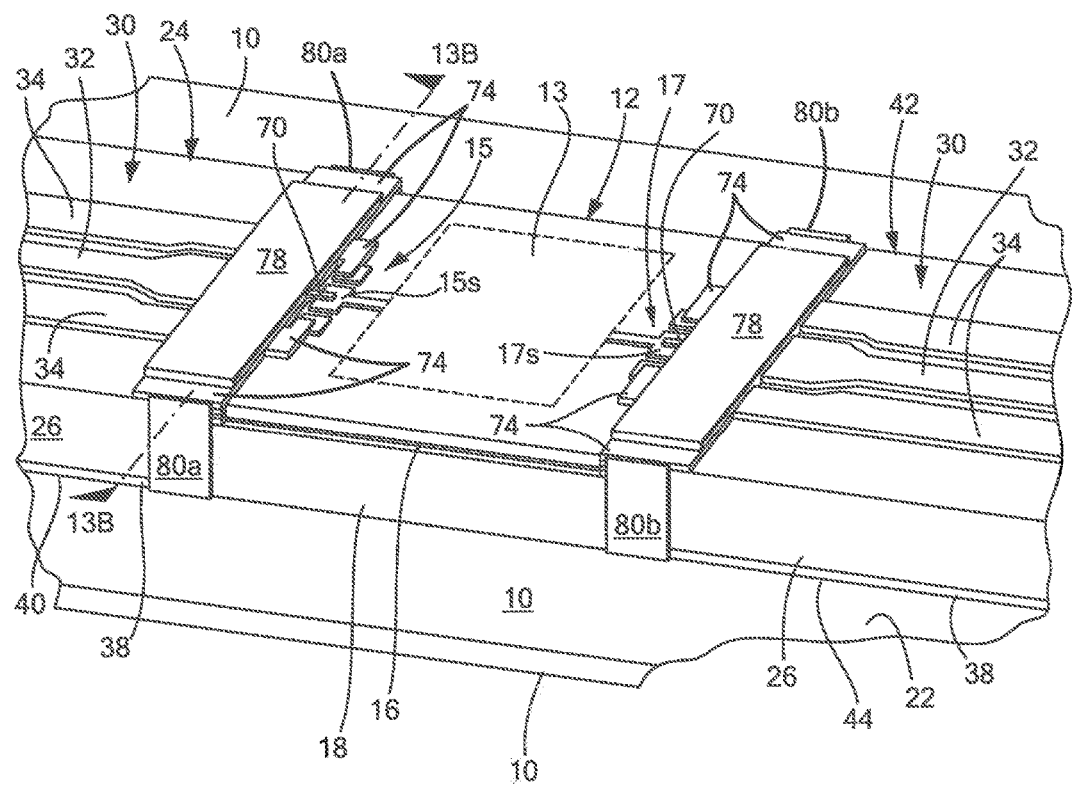
Figure 13B:
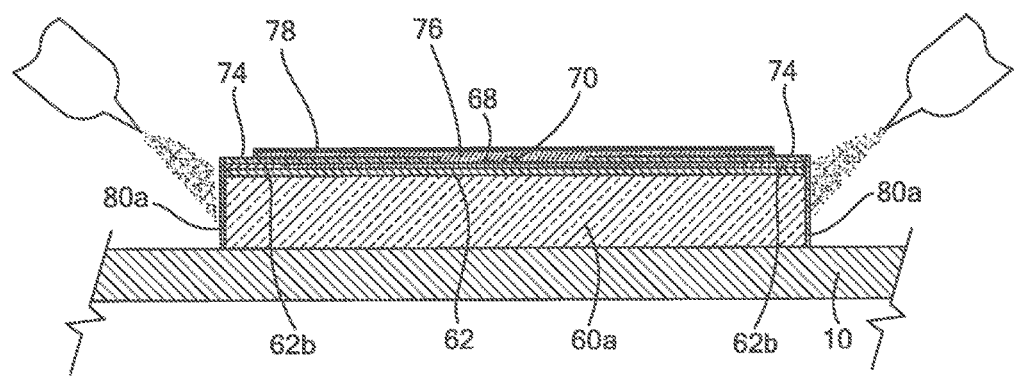

Referring now to FIGS. 13A-13B, the ground shield layer 78 is electrically connected to the support 10 by printing an electrically conductive paste material 80a, 80b, here for example silver or copper nanoparticle ink such as is used to form the signal conductor 70 and the ground lines 74, to the outer sidewalls of the fill-structures 60a, 60b, respectively as indicated, and over outer edges of layers 62, 62a, 62b and conductive ground layer 74 and onto the conductive support 10, as shown. It is noted that the print head of the printer is here tilted, as shown. Next the conductive ink is cared forming the structure shown in FIG. 4. It is noted from FIG. 13A and FIG. 13B that the ground shield layer 78 is electrically insulated from the signal line 70 by dielectric layer 76. It is further noted the dielectric thickness of 76 in the region above signal line 70 is approximately equal to dielectric thickness of 68. Thus, the electrically conductive shield member 78 disposed over the ground layer 74, and connected to, the conductive support 10 form a ground shield around the signal line 70 so that the interconnect structure 9 becomes, in effect, a shielded transmission line.

Figure 14A:
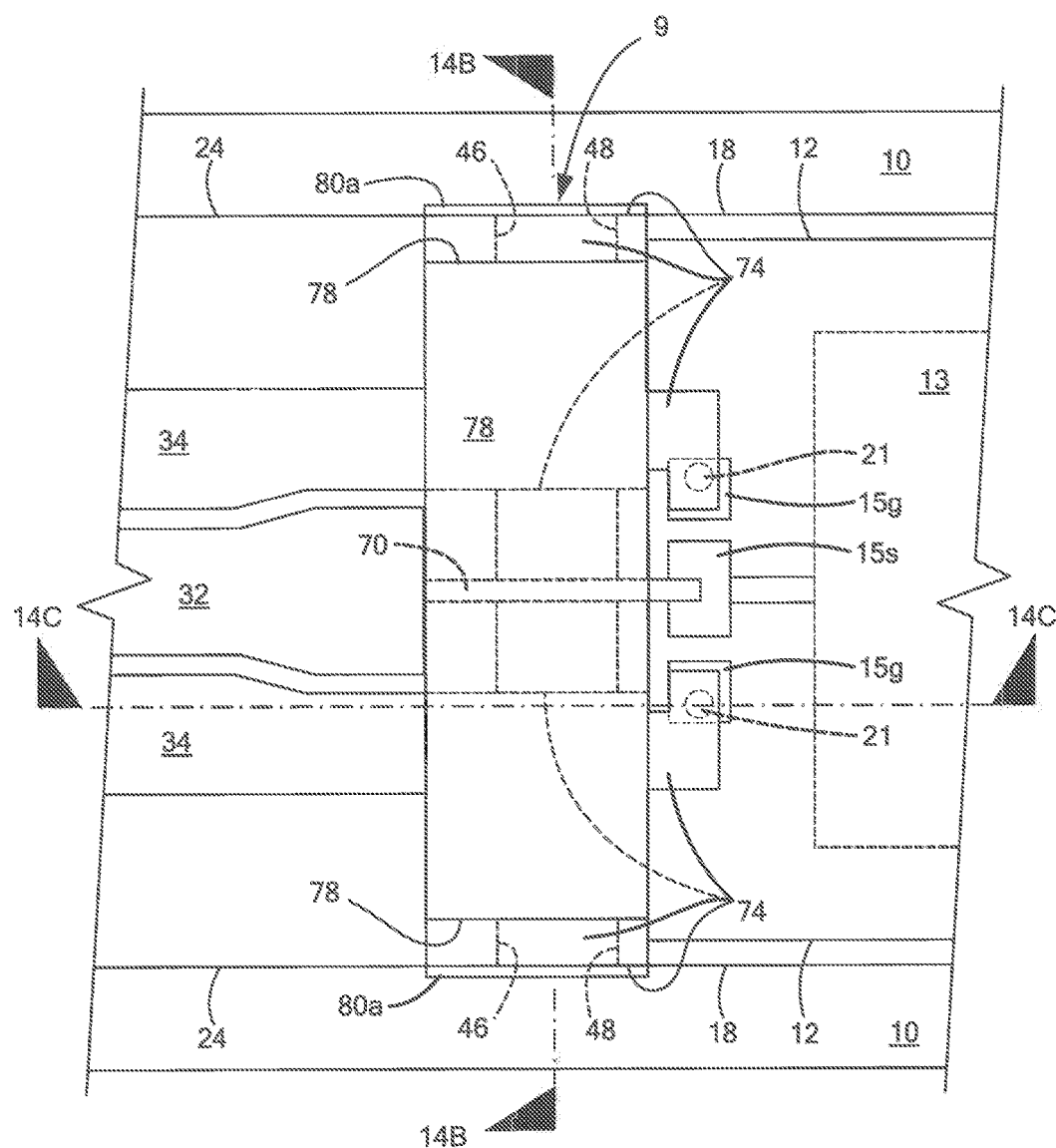

Referring to FIGS. 14A, 14B and 14C, it is noted that the method described above in connection with FIGS. 2A, and 2B through 13A and 13B form the pair of interconnect structure members disposed in the gaps 50, 52 The interconnecting member includes: the fill-structure 60a, 60b, disposed on the upper surface of the support and having opposing sides in direct contact with the opposing sides of the first structure member and the second structure member and in direct contact with the opposing faces of the first structure member and the third structure member, respectively; and an interconnecting microwave transmission line disposed on the fill-structure electrically interconnecting: the microwave transmission line of the second structure member to the MMIC chip (the first structure member); and the MMIC chip 12 to the microwave transmission line of the third member structure, respectively. Referring to FIG. 14B, it is again noted that the ground shield layer 78 is electrically connected to the support 10 and to the ground lines 74.

It is therefore noted that the entire interconnect structure 9 (comprising: the fill-structures 60a, 60b; electrically conductive layers 62; conductive pads 62a-62d; dielectric layer 68; signal line 70; electrically conductive ground lines 74; dielectric layer 76; ground shield layer 78; and electrically conductive material 80 is formed by dispense or by 3D printing process (Additive Manufacturing) wherein the material used to form the interconnect structure 9 is deposited and pattered as successive layers under computer control.

A number of embodiments of the disclosure have been described. Nevertheless, it will be understood that various modifications may be made without departing from the spirit and scope of the disclosure. For example, if the fill structure 60a and 60b are viscous enough to build height without flowing before being cured, the dam structures 58a, 58b, 58c and 58d may not be required. Additionally, the CPW transmission line 30 may be a microstrip transmission line instead. Also, the fill structures 60a, 60b and the dielectric layers 68 and 76 may be one and the same material simplifying the process. An additional dielectric layer (not shown) which may be the same material as dielectric layers 68 and 76 may be added between the fill material 60a and 60b and electrically conductive layer 62 to improve mechanical tolerance such as planarity or electrical tolerance such as dielectric constant or loss tangent. Still further, the heat spreader 18 may be eliminated. Also, the MMIC may be some other type of integrated circuit or microcircuit or merely another printed circuit or microwave transmission line structure. Conductors and dielectrics may be formed by inks or filaments. Accordingly, other embodiments are within the scope of the following claims.

What is claimed is:

1. A structure, comprising:
    a pair of structure members separated by a gap, each one of the pair of structure members having a microwave transmission line;
    an interconnect structure disposed in the gap, the interconnect structure comprising:
        a fill-structure having opposing sides in direct contact with the opposing sides of a first one of the pair of structure members and a second one of the pair of structure member; and,
        an interconnecting microwave transmission line disposed on the fill-structure electrically interconnecting the microwave transmission line of the first one of the pair of structure members to the microwave transmission line of the second one of the pair of structure members.

2. The structure recited in claim 1 wherein the interconnect structure includes an electrically conductive member disposed over a signal line of the interconnecting microwave transmission.

3. The structure recited in claim 1 wherein the interconnect structure includes an electrically conductive layer disposed between the fill-structure and the interconnecting microwave transmission line.

4. The structure recited in claim 3 wherein the interconnect structure includes an electrically conductive member disposed over a signal line of the interconnecting microwave transmission line.

5. The structure recited in claim 2 wherein the interconnecting microwave transmission line includes a signal conductor and a ground conductor and wherein the electrically conductive member is electrically connected to the ground conductor.

6. The structure recited in claim 5 wherein the interconnect structure includes an electrically conductive layer disposed between the fill-structure and the interconnecting microwave transmission line and wherein the conductive layer is electrically connected to the electrically conductive member and to the ground conductor.

7. The structure recited in claim 5 wherein the electrically conductive member is disposed over the signal conductor and electrically connected to the ground conductor.

8. The structure recited in claim 7 wherein the interconnect structure includes an electrically conductive layer disposed between the fill-structure and the interconnecting microwave transmission line and wherein the conductive layer is electrically connected to the electrically conductive member and to the ground conductor.

9. The structure recited in claim 8 the interconnect structure includes a dielectric layer disposed between the electrically conductive layer and the interconnecting microwave transmission line.

10. The structure recited in claim 9 including an electrical conductor disposed on a bottom of the interconnect structure and wherein the electrically conductive member is electrically connected to the electrical conductor disposed on the bottom of the interconnect structure.

11. The structure recited in claim 10 wherein the electrical conductor disposed on the bottom of the interconnect structure comprises a heat spreader.

12. The structure recited in claim 10 including an electrical interconnecting layer disposed on outer sides of the fill material to electrical connect the conductor disposed on the bottom of the interconnect structure to the electrically conductive member.

13. A method for forming a structure, comprising:
providing a pair of structure members on a support, with the pair of structure members being separated by a gap, each one of the pair of structure members having a microwave transmission line;
providing an interconnect structure in the gap, the interconnect structure being formed by a method comprising:
forming a fill-structure comprising disposing an insulating material in the gap with such material filling in the gap to fill the gap and flowing in direct contact with the opposing sides of a first one of the pair of structure members and a second one of the pair of structure member; and,
forming an interconnecting microwave transmission line on the fill-structure electrically interconnecting the microwave transmission line of the first one of the pair of structure members to the microwave transmission line of the second one of the pair of structure members.

14. The method recited in claim 13 including forming an electrically conductive member disposed over a signal line of the interconnecting microwave transmission.

15. The method recited in claim 13 wherein the interconnecting microwave transmission line is printed by dispense, jet or filament onto the fill-structure.

16. The method recited in claim 13 including forming by dispense, jet or filament a dielectric layer over a signal line of the interconnecting microwave transmission line.

17. The method recited in claim 14 wherein the electrically conductive member is printed by dispense, jet or filament over the dielectric layer.

18. The method recited in claim 17 including forming an electrical interconnecting layer on outer sides of the fill material to electrical connect the conductor disposed on a conductor on a bottom of the interconnect structure to the electrically conductive member.

19. A method for forming a structure, comprising:
providing a pair of structure members on a support, with the pair of structure members being separated by a gap, each one of the pair of structure members having a microwave transmission line;
forming an interconnect structure in the gap comprising using 3D printing.

* * * * *